United States Patent
Zogakis et al.

(10) Patent No.: US 6,992,606 B2
(45) Date of Patent: Jan. 31, 2006

(54) METHOD AND CIRCUIT FOR MULTI-STANDARD SIGMA-DELTA MODULATOR

(75) Inventors: Thomas Nicholas Zogakis, Plano, TX (US); Himamshu G. Khasnis, Karnataka (IN); Baireddy Vijayavardhan, Sirisanagandla (IN)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 10/865,275

(22) Filed: Jun. 10, 2004

(65) Prior Publication Data

US 2005/0007267 A1    Jan. 13, 2005

Related U.S. Application Data

(60) Provisional application No. 60/485,939, filed on Jul. 9, 2003.

(51) Int. Cl.
*H03M 1/20*    (2006.01)
*H03M 3/00*    (2006.01)

(52) U.S. Cl. .................................. 341/131; 341/143

(58) Field of Classification Search ............... 341/131, 341/143, 172, 118, 120, 155, 156, 164; 330/9; 332/109
See application file for complete search history.

(56) References Cited

U.S. PATENT DOCUMENTS

| | | | | |
|---|---|---|---|---|
| 5,248,972 A | * | 9/1993 | Karema et al. | 341/143 |
| 5,886,586 A | * | 3/1999 | Lai et al. | 332/109 |
| 6,061,009 A | * | 5/2000 | Krone et al. | 341/143 |
| 6,157,331 A | * | 12/2000 | Liu et al. | 341/143 |
| 6,166,676 A | * | 12/2000 | Iizuka | 341/172 |
| 6,462,685 B1 | * | 10/2002 | Korkala | 341/131 |
| 6,489,907 B2 | * | 12/2002 | Cusinato et al. | 341/143 |
| 6,515,540 B1 | * | 2/2003 | Prasad et al. | 330/9 |
| 6,621,435 B2 | * | 9/2003 | Cusinato et al. | 341/143 |
| 6,765,520 B1 | * | 7/2004 | Chuang et al. | 341/143 |
| 6,768,436 B1 | * | 7/2004 | Chuang | 341/143 |

* cited by examiner

*Primary Examiner*—Patrick Wamsley
(74) *Attorney, Agent, or Firm*—Abdul Zindani; W. James Brady, III; Frederick J. Telecky, Jr.

(57) ABSTRACT

System and method for a multi-standard sigma-delta modulator. A preferred embodiment comprises an integrator coupled to a signal input, wherein the integrator is configured to sum a difference between an input signal and an output of the sigma-delta modulator. A dithering circuit, also coupled to the signal input, is used to produce a dithering sequence. A summing point combines an output of the integrator and the dithering circuit while a quantizer converts the combined outputs into one of several discrete levels. The sigma-delta modulator further comprises a reset circuit to reset the sigma-delta modulator if the integrator becomes saturated. The sigma-delta modulator, as described, is compatible with G.Lite, ADSL, and ADSL+ variants of the digital subscriber line technical standards.

27 Claims, 6 Drawing Sheets

METHOD AND CIRCUIT FOR MULTI-STANDARD SIGMA-DELTA MODULATOR

This application claims the benefit of U.S. Provisional Application No. 60/485,939, filed Jul. 9, 2003, entitled "Sigma-Delta Modulator for Multiple DSL Standards", which application is hereby incorporated herein by reference.

TECHNICAL FIELD

The present invention relates generally to a system for digital communications, and more particularly to a system and method for a multi-standard sigma-delta modulator.

BACKGROUND

Digital-to-analog converters (DACs) can be used to convert digital signals into an analog representation of the same signal. DACs can be used in wide variety of applications, ranging from medical and entertainment to communications (both for voice and data). One form of DAC that is commonly used is what is known as a sigma-delta DAC. A sigma-delta DAC can make use of a sigma-delta modulator to convert an oversampled, band-limited digital signal into an output signal. Note that the output signal may be a single-bit (representing two levels) signal or a multi-bit (representing $2^N$ levels, wherein N is the number of bits) signal. The output signal can then be converted into an analog signal via a conventional DAC and then filtered by a smoothing filter to provide an analog representation of the digital signal. An advantage of a sigma-delta DAC is the noise shaping that is inherent in the design of the DAC. The noise shaping increases as the oversampling rate of the sigma-delta DAC increases. It may be preferred that a sigma-delta modulator for a sigma-delta DAC oversample at a rate of 32 or 64 (or higher).

A design of a sigma-delta modulator can feature differing values for order (which can specify the sharpness of the noise shaping performed by the sigma-delta modulator), the number of bits in the output signal (which can affect the stability and noise level of the modulator), stability handling techniques, and so forth. A fairly standard sigma-delta modulator may be a first order sigma-delta modulator with a single-bit output signal. The design of such a sigma-delta modulator can be relatively straight forward, therefore, easy and inexpensive to design. Furthermore, with a single-bit output signal, the routing of the output signal line can be relatively simple.

One disadvantage of the prior art is that of being a low-order sigma-delta modulator, noise suppression may not occur as rapidly as desired or needed, i.e., the order is not high enough. Sufficient noise suppression may simply require a higher order sigma-delta modulator, which can be more difficult to design and may not be able to operate at sufficient frequencies.

A second disadvantage of the prior art is that the use of a single bit output line can require that the sigma-delta modulator operate at a higher frequency than a similar sigma-delta modulator with multiple bit output lines. Since power consumption rises with the square of the operating frequency, the sigma-delta demodulator operating at a lower frequency can consume less power.

Another disadvantage of the prior art is that the high oversampling rate of the sigma-delta modulator (32, 64, or higher) can result in a design that may be hard to clock, especially if the signal being converted has a high clock rate of its own. For example, given a signal with a clock rate of 4 MHz, a sigma-delta modulator with an oversampling rate of 32 would require a clock of 128 MHz, while a 64 times oversampling sigma-delta modulator would require a clock of 256 MHz.

SUMMARY OF THE INVENTION

These and other problems are generally solved or circumvented, and technical advantages are generally achieved, by preferred embodiments of the present invention which provides a system for a multi-standard sigma-delta modulator.

In accordance with a preferred embodiment of the present invention, a sigma-delta modulator comprising an integrator coupled to a signal input. The integrator is configured to sum a difference between an input signal provided at the signal input and an output produced by the sigma-delta modulator. A dithering circuit is also coupled to the signal input. The dithering circuit is configured to produce a dithering sequence. A summing point combines outputs produced by the integrator and the dithering circuit, and a quantizer converts an output of the summing point into one of several discrete levels. The sigma-delta modulator also comprises a reset circuit coupled to the integrator. The reset circuit is configured to reset the sigma-delta modulator if the integrator becomes saturated. Other embodiments of the invention provide other features.

In accordance with another preferred embodiment of the present invention, a multi-standard digital subscriber line (DSL) sigma-delta digital-to-analog converter (DAC) comprising an inverse Fourier transform unit that is coupled to a signal input, the inverse Fourier transform unit configured to convert a frequency domain symbol into a time domain symbol. An interpolation chain is coupled to the inverse Fourier transform unit and is configured to upsample time domain symbols. The multi-standard DSL sigma-delta DAC also comprises a sigma-delta modulator configured to convert the time domain symbol into an analog signal, wherein the sigma-delta modulator includes a dithering circuit and a reset circuit. Other embodiments of the invention provide other features.

In accordance with another preferred embodiment of the present invention, a method for resetting a sigma-delta modulator comprising determining if an integrator in the sigma-delta modulator is operating in saturation. Furthermore, the sigma-delta modulator is reset if the integrator has been operating in saturation for a specified amount of time. Other embodiments of the invention provide other features.

In accordance with yet another preferred embodiment of the present invention, a method for maintaining sigma-delta modulator stability comprising combining a dithering sequence with an output of an integrator, wherein the integrator is a part of the sigma-delta modulator. Additionally, a determination is made as to whether the sigma-delta modulator has become unstable. The method also comprises resetting the sigma-delta modulator if the sigma-delta modulator has become unstable. Other embodiments of the invention provide other features.

An advantage of a preferred embodiment of the present invention is that with a 4th-order sigma-delta modulator, a good compromise can be achieved between noise shaping properties and design complexity.

A further advantage of a preferred embodiment of the present invention is with dynamic dithering, the sigma-delta modulator's stability range can be increased.

Yet another advantage of a preferred embodiment of the present invention is the use of a multi-bit output signal line permits a lower operating frequency for the sigma-delta modulator, thereby reducing power consumption.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a communications system that is adherent to several of the asymmetric digital subscriber line (ADSL) technical specifications, such as G.lite, ADSL, and ADSL+. The ADSL technical specifications can be found in a document entitled "International Telecommunication Union-ITU-T G.992.1-Series G: Transmission Systems and Media, Digital Systems and Networks, Digital Transmission Systems-Digital Sections and Digital Line System-Access Networks-Asymmetric Digital Subscriber Line (ADSL) Transceivers," published June 1999. The invention may also be applied, however, to other asymmetric digital subscriber line systems, such as ADSL2 and ADSL2+, and to other digital subscriber line (DSL) systems. Note that in most instances, DSL and ADSL can be used interchangeably. Furthermore, the present invention can have applications in other systems wherein there is a need for a high frequency, high performance sigma-delta modulator.

Figure 1:
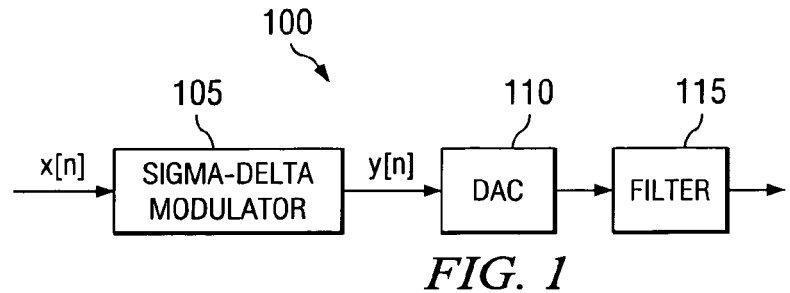
FIG. 1 is a diagram of an exemplary sigma-delta digital-to-analog converter (DAC)

With reference now to FIG. 1, there is shown a diagram illustrating an exemplary sigma-delta digital-to-analog converter (DAC) 100. The sigma-delta DAC 100 can be built out of a sigma-delta modulator 105, a DAC 110, and a filter 115. The sigma-delta modulator 105 can have as an input, a band-limited signal, and can produce a digital output signal. The digital output signal can be a single bit signal or a multi-bit signal. The DAC 110 can be used to convert the digital output signal into a corresponding analog signal while the filter 115 can provide necessary smoothing and averaging. The filter 115 can also be used to help eliminate quantization noise that can reside in upper frequency ranges. Furthermore, there can also be a need to reject any images of the band-limited signal that may be present at the output Nyquist rate.

An advantage in using a sigma-delta modulator is its ability perform noise shaping. Noise shaping can be used to effectively push noise components to a frequency range that is above a frequency band of interest. The noise shaping ability of a sigma-delta modulator can be dependent upon its oversampling rate. Oversampling rates of approximately 64 times (and sometimes more) the clock rate of the signal being converted is considered to be adequate in moving the noise beyond the frequency band of interest. Unfortunately, this high oversampling rate can sometimes be a limiting factor in the decision to use a sigma-delta modulator, since in some applications, the high clock needed to operate the sigma-delta modulator may not be readily available.

Figure 2:
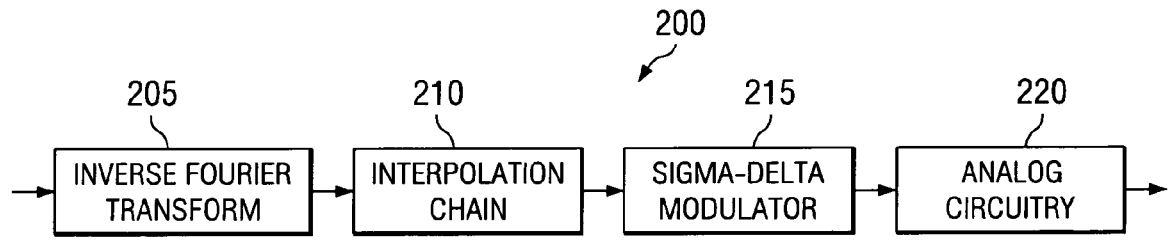
FIG. 2 is a diagram of a sigma-delta DAC used in an asymmetric digital subscriber line (ADSL) application.

With reference now to FIG. 2, there is shown a diagram illustrating a sigma-delta DAC 200 that is being used in an asymmetric digital subscriber line (ADSL) application, such as G.lite, ADSL, ADSL+, and so on. Note that in many instances, ADSL and DSL can be used interchangeably. A DSL symbol, which is created in the frequency domain can be provided to an inverse Fourier transform unit 205 that can be used to create a time domain representation of the DSL symbol. The time domain version of the DSL symbol may then be provided to an interpolation chain 210, which can be used to up-sample the time domain DSL symbol. The up-sampled time domain DSL symbol can then be provided to a sigma-delta modulator 215 wherein a digital output signal can be produced. The digital output signal may be a single bit signal or a multi-bit signal. The digital output can then be converted into an analog signal by a DAC and then provided to analog circuitry 220 where a filter can provide needed smoothing and averaging, along with noise elimination. Note that since the sigma-delta DAC comprises both the sigma-delta modulator 215 and the DAC (not shown), it may encompass both the sigma-delta modulator 215 and a portion of the analog circuitry 220. The analog circuitry 220 may also contain circuits such as amplifiers and additional filters that may be needed to prepare the signal for transmission.

Figure 3:
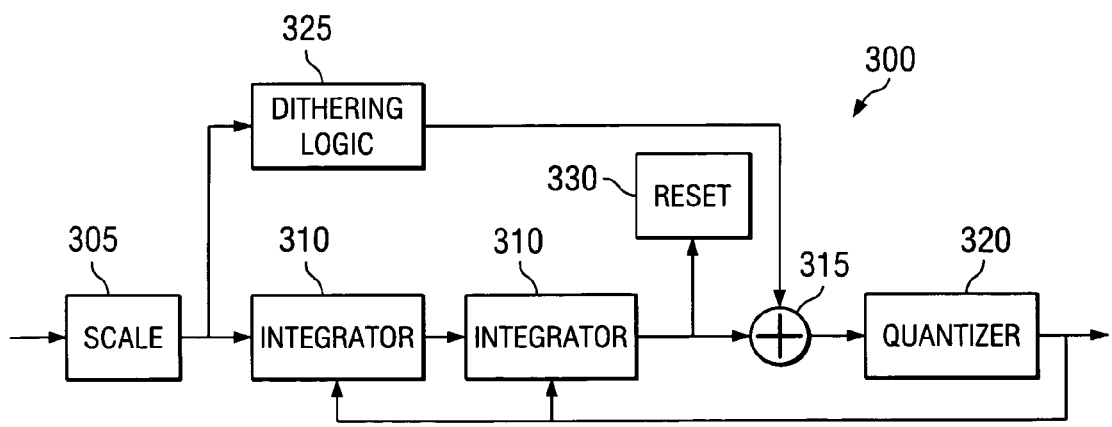
FIG. 3 is a diagram of a sigma-delta modulator with built-in reset and dithering logic, according to a preferred embodiment of the present invention.

With reference now to FIG. 3, there is shown a diagram illustrating a sigma-delta modulator 300 with built-in reset and dithering logic, according to a preferred embodiment of the present invention. The sigma-delta modulator 300 can be used to create a sigma-delta DAC, such as the sigma-delta DAC 200 (FIG. 2), with the sigma-delta modulator 300 possibly being an implementation of the sigma-delta modulator functional block 215 shown in FIG. 2.

The sigma-delta modulator 300, shown in FIG. 3, can be logically divided into two paths: a lower path made up of two integrators (both labeled 310) and an upper path made up of a dithering logic block 325. A scale unit 305 can be present in the sigma-delta modulator 300 prior to the upper and lower paths. A summing point 315 can be used to combine signals from the lower and upper paths and a quantizer 320 can be used to convert a continuous-time signal into a discrete-time signal. The sigma-delta modulator 300 can also include a reset circuit 330.

The lower path may be considered the main path of the sigma-delta modulator 300, wherein a discrete-time signal that is to be converted into an analog signal by the delta-sigma DAC 200 can be converted into a single bit (or multi-bit) signal. An initial scaling operation (via the scale unit 305) on the discrete-time signal can be used to ensure a unity signal transfer function. The lower path, with its two integrators 310 may implement a sigma-delta modulator of order that is greater than or equal to two. Should the sigma-delta modulator be a first-order modulator, then a single integrator 310 may suffice. The summing point 315 combines the output of the dithering logic block 325 with the output of the two integrators 310. A discussion of the dithering logic block 325 can be found below. Finally, the quantizer 320 may be used to quantize the combination of the outputs of the two integrators 310 with that of the dithering logic block 325 into one of two values (a single bit output) or one of $2^N$ values (an N-bit output). According to a preferred embodiment of the present invention, the sigma-delta modulator 300 produces a two-signal line output, implying that the quantizer 320 is a two-bit (four value) quantizer.

In DSL applications, when no data is being transmitted, the various DSL technical standards mandate that all zeros be transmitted. Unfortunately, the transmission of all zeros can present a problem for the sigma-delta modulator 300. The upper path, which comprises the dither logic block 325 can be used to help the sigma-delta modulator 300 circumvent problems associated with sending all zeros. This path also helps eliminate tones in the output for some input signals.

The DSL technical specifications, such as G.lite, ADSL, and ADSL+, can require a sigma-delta modulator 300 to support signal bandwidths of 1.104 MHz and 2.208 MHz. A typical sigma-delta modulator using oversampling rates of 64 times oversampling (and more) may then need to operate frequencies of 282.624 MHz and greater. Such high operating frequencies may not be conducive low-cost, low-power applications, such as mass-market DSL modems. Since high operating frequencies may require higher technology fabrication lines, the cost of DSL modems using the high operating frequency sigma-delta modulator may be greater than one using a sigma-delta modulator operating at lower operating frequencies.

A sigma-delta modulator that is operating a lower oversampling rates may require that the modulator operate in a more aggressive manner. This can lead to a sigma-delta modulator that can be inherently unstable. To help mitigate the instability of such an aggressively designed sigma-delta modulator, the reset circuit 330 can permit the sigma-delta modulator to recover. The reset circuit 330 can allow the sigma-delta modulator to reset itself (or be reset) once it has become unstable. Note that while the sigma-delta modulator 300 may be inherently unstable, the probability of the sigma-delta modulator 300 actually becoming unstable in normal operations remains low.

The discussion of the sigma-delta modulator 300 presented below, uses a specific implementation of a sigma-delta modulator 300 that is used in a DSL modem and is capable of supporting DSL technical standards: G.lite, ADSL, and ADSL+. The sigma-delta modulator 300 operates at a clock frequency of 70.656 MHz and with signal bandwidths of up to 2.208 MHz. The specific values provided below are for this particular implementation of the sigma-delta modulator 300. If the sigma-delta modulator 300 were to be used in a different application, with different operating frequencies, signal bandwidths, and so forth, it is expected that the values would be different.

Figure 4:
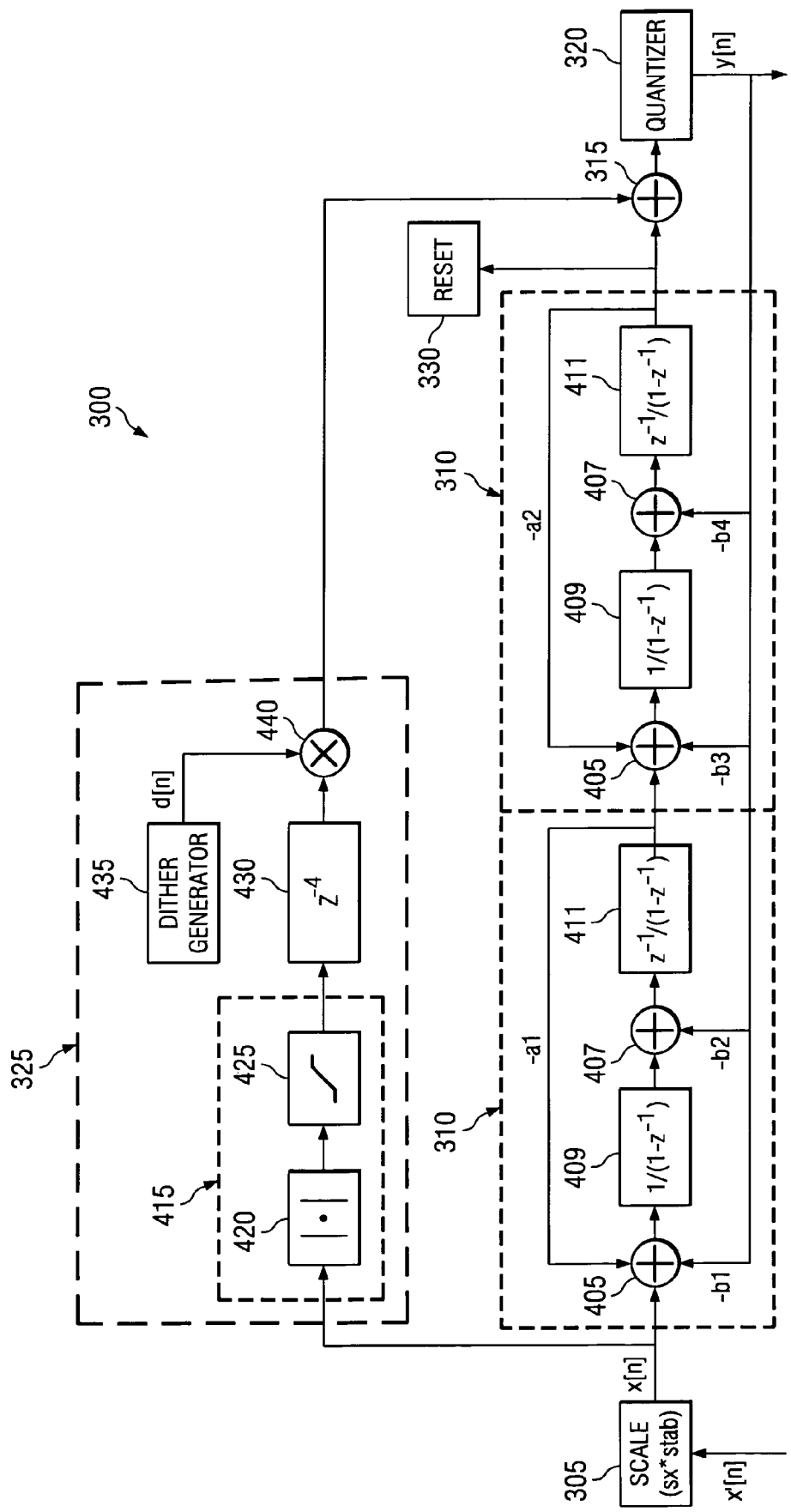
FIG. 4 is a diagram of a detailed view of the sigma-delta modulator shown in FIG. 3, according to a preferred embodiment of the present invention.

With reference now to FIG. 4, there is shown a diagram illustrating a detailed view of the sigma-delta modulator 300, according to a preferred embodiment of the present invention. An input signal, x'[n], can be provided to a signal input of the sigma-delta modulator 300, wherein it can be provided to the scale unit 305. According to a preferred embodiment of the present invention, the scale unit 305 can perform a multiplication of the input signal x'[n] with a first scale factor 'sx' and a second scale factor 'stab' wherein the first scale factor 'sx' can be used to scale the input signal x'[n] to ensure a unity signal transfer function (STF) for the sigma-delta modulator 300. For the sigma-delta modulator 300 operating at a frequency of 70.656 MHz and for use in DSL applications, it is preferred that the scale factor 'sx' be essentially equal to 0.127 (0.12735753993847 to be precise).

The second scale factor 'stab' can be used to ensure that the output of the sigma-delta modulator 300 remains within the stable output range of the sigma-delta modulator 300, i.e., ensure that the magnitude of the output of the sigma-delta modulator 300 for a large variety of input signals remains below a certain value. For the sigma-delta modulator 300, tests using a DC input have shown that a maximum stable output range to be around 0.34 (i.e., 'stab'=0.34). However, for inputs that would be seen in a DSL system, such as single tones and discrete multi-tone (DMT) signals, the stability range can be significantly larger. For example, a DMT signal with a peak-to-average ratio (PAR) as large as 19 dB could be introduced at the input of the sigma-delta modulator 300 without having the sigma-delta modulator 300 becoming unstable. For input signals with a target PAR of 17 dB, this corresponds to a 'stab'=0.79. Therefore, to be conservative, it is preferred that 'stab' be equal to 0.35.

Note that it may be possible to perform the scaling at lower frequencies (lower than the operating frequency of the sigma-delta modulator 300) by applying the scaling in earlier interpolation stages, prior to the sigma-delta modulator 300 (such as in the interpolation chain 210 (FIG. 2)).

The input signal x'[n], after scaling, can be denoted x[n], may then be provided to both the upper and lower paths of the sigma-delta modulator 300. As discussed above, the lower path includes a pair of integrators 310. In the sigma-delta modulator 300, the integrators 310 are identical and the discussion of the first integrator can apply to the second integrator. The integrator 310 can comprise a pair of summing points 405 and 407 and a pair of first order integrators 409 and 411, making the integrator 310 a second-order integrator. With two second order integrators, the sigma-delta modulator 300 is a fourth-order sigma-delta modulator. Note that in other designs, the integrators in the lower path may not necessarily be identical.

The first summing point 405 can combine an input signal to the integrator 310 with a signal being fedback from the output of the integrator 310 with a signal being fedback from the output of the sigma-delta modulator 300. The second summing point 407 can combine the output of the first integrator 409 with the signal being fedback from the output of the sigma-delta modulator 300. According to a preferred embodiment of the present invention, the signals being fedback can be scaled prior to being combined in the first and the second summing points. For example, the signal being fedback from the output of the integrator 310 may be scaled (scale factor 'a1') prior to combining. The signal being fedback from the output of the sigma-delta modulator 300 may also be scaled (scale factors 'b1' and 'b2') prior to combining, but the scaling may be different for the first and the second summing points. It is preferred that the scale factor 'a1' be essentially equal to 0.0177 (0.01776642806738 to be precise), while the scale factor 'b1' be essentially equal to 0.109 (0.10950951822876 to be precise) and scale factor 'b2' be essentially equal to 0.419 (0.41941901226110 to be precise). Note that the feedback may be negative in nature, so the scaled feedback signals can be subtracted via the summing points 405 and 407.

The second integrator 310 may be similar to the first integrator 310 described above with the exception of the scale factors used in the fedback of the signals to the summing points 405 and 407. The scale factors used in the second integrator 310 may be referred to with different labels from the scale factors used in the first integrator 310 to help reduce confusion. A scale factor 'a2' (analogous to the scale factor 'a1' from the first integrator 310) can be preferred to be essentially equal to 0.000602 (0.00060236260760 to be precise), while scale factors 'b3' and 'b4' (analogous to the scale factors 'b1' and 'b2' from the first integrator 310) can be preferred to be essentially equal to 1.003 and 0.852 (1.00399021176998 and 0.85229868030050 to be precise), respectively. Again, the feedback may be negative in nature, so the scaled feedback signals can be subtracted via the summing points 405 and 407.

The upper path includes the dithering logic block 325, which can be used to help eliminate problems with idle tones that are generated for some low-amplitude input signals. The dithering logic block 325 implements a dynamic dithering algorithm rather than a static dithering algorithm to help avoid a reduction in the stability of the sigma-delta modulator 300. Dithering can be applied to signals with magnitudes less than a specified threshold, while for signals with magnitudes greater than the specified threshold, no dither may be applied. Note that the amount of dithering may be graduated, depending upon the magnitude of the signal. For example, if the signal has a magnitude below a first threshold, then full dithering may be applied, while if the magnitude is between the first and a second threshold, then the dithering may be scaled down by a certain percentage. The dithering may be continually scaled until when the signal magnitude exceeds the specified threshold, no dithering is applied.

An input signal x[n], traversing the upper path, may be provided to a magnitude quantization unit 415. The magnitude quantization unit 415 can be used to scale the amount of dithering based upon the magnitude of the input signal x[n]. The magnitude quantization unit 415 comprises a magnitude unit 420 that can be used to obtain an absolute value measurement of the input signal x[n]. The magnitude of the input signal can then be provided to a non-linear quantizer 425, which can quantize the magnitude of the input signal into one of several values. The non-linear quantizer 425 can be used to scale the amount of dithering applied to the input signal x[n] as described above. For example, if the magnitude of the input signal is less than the first threshold, then the non-linear quantizer 425 may quantize it to its maximum output value, while if the magnitude of the input signal is greater than the first threshold but less than the second threshold, then the non-linear quantizer 425 may quantize it to its second largest output value, and so forth. A delay 430 can be used to synchronize the output of the non-linear quantizer 425 with the output of the last integrator 411 in the lower path. The output of a dither generator 435 and the output of the non-linear quantizer 425 can then be combined by a summing point 440, producing an output of the dithering logic block 325. A detailed discussion of the dither generator 435 is provided below.

Signals from the upper and the low paths may be combined by the summing point 315, which can provide the combined signals to the quantizer 320. The quantizer 320 is preferably a four (4) level quantizer (based upon the use of two output lines for the sigma-delta modulator 300). The quantizer 320 may use four levels: $-1$, $-\frac{1}{3}$, $\frac{1}{3}$, and 1.

Figure 5:
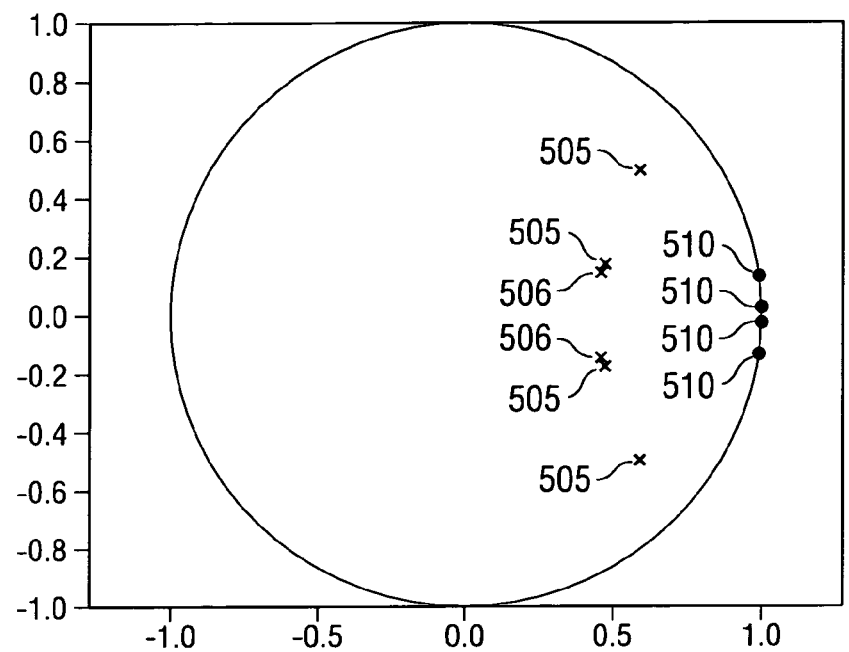
FIG. 5 is a pole-zero plot of a noise transfer function of the sigma-delta modulator shown in FIG. 3, according to a preferred embodiment of the present invention.

With reference now to FIG. 5, there is shown a data plot illustrating a pole-zero plot of the noise transfer function (NTF) of the sigma-delta modulator 300 with scaling factors discussed above, according to a preferred embodiment of the present invention. The NTF for the sigma-delta modulator 300 features four poles and four zeroes. Note that FIG. 5 displays a pole-zero plot with both quantized and unquantized poles 505 and zeroes 510. Furthermore, the quantized and unquantized zeroes 510 remain in the same position on the unit circle, while some of the quantized and unquantized poles 505 move slightly (quantized poles 506). The unquantized poles and zeroes are the result of representing the scale factors (discussed in FIG. 3) as double precision values and the quantized poles and zeroes are the result of rounding the representation of the scale factors.

Figure 6:
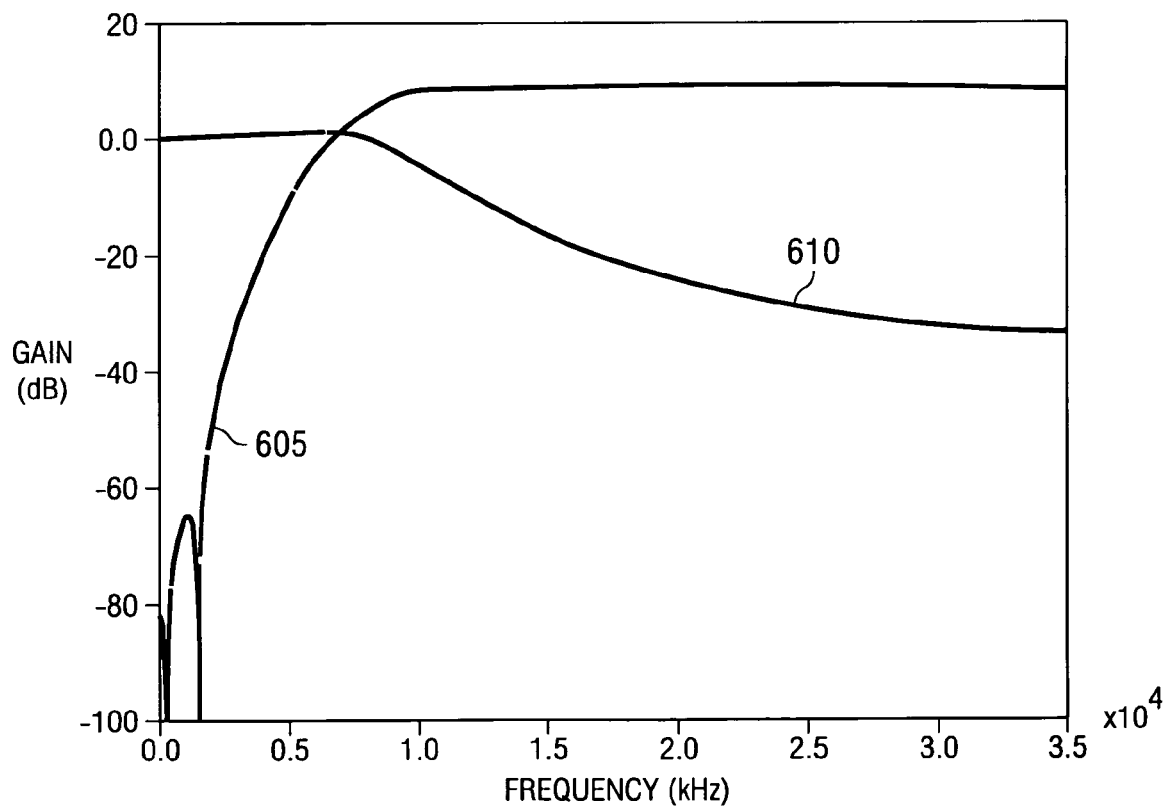
FIG. 6 is a data plot of a noise transfer function and signal transfer function of the sigma-delta modulator shown in FIG. 3, according to a preferred embodiment of the present invention.

With reference now to FIG. 6, there is shown a data plot illustrating plots of the NTF and the signal transfer function (STF) of the sigma-delta modulator 300 with scaling factors discussed above, as a function of frequency, according to a preferred embodiment of the present invention. A first curve 605 displays the NTF as a function of frequency and a second curve 610 displays the STF as a function of frequency. FIG. 6 displays both the quantized and unquantized NTF 605 and STF 610 for the sigma-delta modulator 300. Note that both the quantized and unquantized NTF 605 and STF 610 lay essentially on top of one another, showing that any error resulting from the quantization is small and may be negligible.

Figure 7:
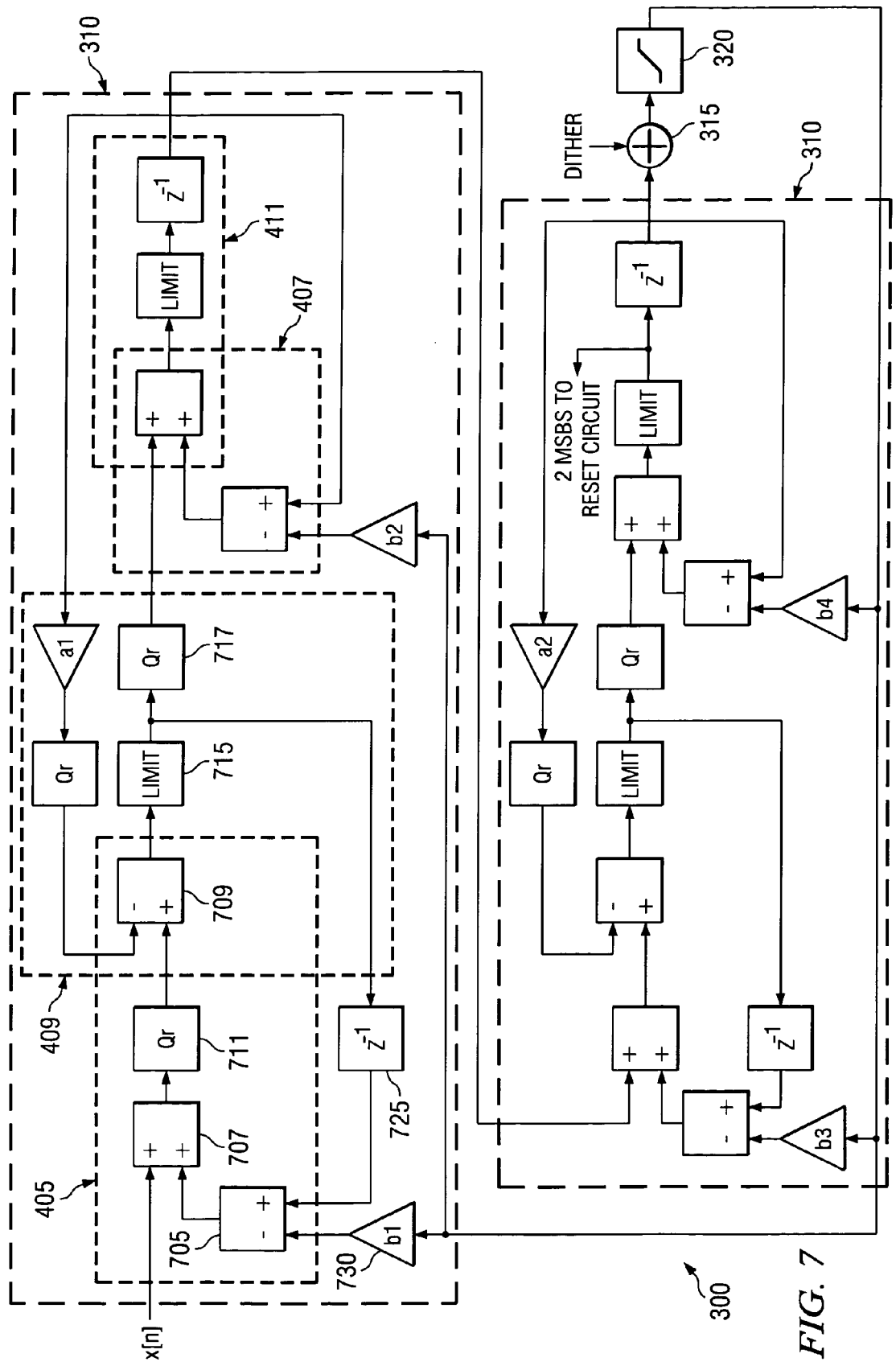
FIG. 7 is a diagram of a detailed view of an implementation of the sigma-delta modulator shown in FIG. 3, according to a preferred embodiment of the present invention.

With reference now to FIG. 7, there is shown a diagram illustrating a detailed view of the sigma-delta modulator 300, wherein multiplications have been replaced with shifts and adds, according to a preferred embodiment of the present invention. FIG. 7 displays a possible implementation of the sigma-delta modulator 300 shown in FIG. 3. As shown in FIG. 3, the sigma-delta modulator 300 could require up to six (6) multiplications every clock cycle, wherein according to a preferred embodiment of the present invention, the clock is operating at 70.656 MHz. It can be possible to simplify the implementation by optimizing each of these six multiplications so that a multiplier is actually not required. For the feedback paths involving the scale factors 'a1' and 'a2' (feedback loops from the output of the integrator 310 to the input of the same integrator 310), the scale factors can be represented in canonical signed digit (CSD) form and the multiplications can then be implemented as shifts and adds. The representation of numbers in their CSD form and using the CSD form to implement a multiplication as shifts and adds is considered well understood by those of ordinary skill in the art of the present invention. A Table #1 below lists the CSD forms of the scale factors 'a1' and 'a2' and a corresponding error from the use of the CSD forms.

TABLE #1

CSD Representation of scale factors 'a1' and 'a2'

| Scale Factor | Value | CSD Form | Percentage Error |
|---|---|---|---|
| a1 | 0.01776642806738 | $2^{-6} + 2^{-9} + 2^{-12}$ | 0.3143 |
| a2 | 0.00060236260760 | $2^{-11} + 2^{-13} - 2^{-17}$ | 0.0597 |

The four remaining multiplications involve an output of the quantizer 320 as it is scaled (by scale factors 'b1,' 'b2,' 'b3,' and 'b4') and fedback to the integrators 310. As discussed previously, the quantizer 320 is chosen to produce four levels: −1, −⅓, ⅓, and 1. A two-bit binary representation of the quantizer levels may be as follows: $10_2$ can represent −1, $11_2$ can represent −⅓, $00_2$ can represent ⅓, and $01_2$ can represent 1. For the scale factors 'b1,' 'b3,' and 'b4', two values for each scale factor can be stored in a lookup table (in CSD format): the scale factor itself and the scale factor multiplied by ⅓. The binary representation of the quantizer output can be used to determine if the scale factors are added or subtracted. A Table #2 below lists the CSD forms of the scale factors 'b1,' 'b2,' 'b3,' and 'b4' and a corresponding error from the use of the CSD forms after the scale factors have been divided by a peak reference level of 1.50, now referred to as "b1'," "b2'," "b3'," and "b4'."

TABLE #2

CSD Representation of scale factors "b1'," "b2'," "b3'," and "b4'"

| Scale Factor | Value | CSD Form | Percentage Error |
|---|---|---|---|
| b1' | 0.07300634548584 | $2^{-4} + 2^{-6} - 2^{-8} - 2^{-10}$ | 0.3230 |
| b2' | 0.27961267484074 | $2^{-2} + 2^{-5} - 2^{-9}$ | −0.1129 |
| b3' | 0.66932680784666 | $1 - 2^{-2} - 2^{-4} - 2^{-6}$ | 0.3807 |
| b4' | 0.56819912020033 | $2^{-1} + 2^{-4} + 2^{-8}$ | −0.3155 |

Since the scale factors "b1'," "b2'," "b3'," and "b4'" had been divided reference level of 1.50, the products, such as b1'*0.5=b⅓ and b1'*1.50=b1, can be computed with the same precision. A Table #3 below shows the resulting products, which can be stored in a lookup table.

TABLE #3

Stored product values

| Product | Value | Percentage Error |
|---|---|---|
| b1 | 0.10950951822876 | 0.3230 |
| b1/3 | 0.03650317274292 | 0.3230 |
| b2 | 0.41941901226110 | −0.1129 |

TABLE #3-continued

Stored product values

| Product | Value | Percentage Error |
|---|---|---|
| b2/3 | 0.13980633742037 | −0.1129 |
| b3 | 1.00399021176998 | 0.3807 |
| b3/3 | 0.33466340392333 | 0.3807 |
| b4 | 0.85229868030050 | −0.3155 |
| b4/3 | 0.28409956010017 | −0.3155 |

The implementation of the sigma-delta modulator 300 shown in FIG. 7 makes use of the CSD representation of the scale factors to eliminate the need to perform multiplications. FIG. 7 displays the lower path of the sigma-delta modulator 300, including the two integrators 310, the summing point 315 (wherein the dithering produced in the upper path can be combined), and the quantizer 320. Since the two integrators 310 are essentially identical, the discussion of one integrator 310 is sufficient.

The integrator 310 comprises the pair of summing points 405 and 407 and the pair of first order integrators 409 and 411. Due to the implementation, it may not be possible to clearly delineate the summing points 405 and 407 and the first-order integrators 409 and 411. The summing point 405 comprises a series of two-input adders 705, 707, and 709. The first two-input adder 705 can be used to combine the scaled output of the quantizer 320 with a delayed output of the first-order integrator 409 (via a delay 725), while the second two-input adder 707 can be used to combine the output of the first two-input adder 705 with the input signal x[n]. The third two-input adder 709 can combine a rounded (via rounding circuit 711) output of the second two-input adder 707 with a scaled output of the first integrator 310.

However, the third two-input adder can also perform the summation (integration) performed by the first-order integrator 409. A limiting unit 715 can use logic to effectively place a limit on the precision of the output of the third two-input adder 709. A second rounding circuit 717 can perform rounding on the output of the first-order integrator 409. The scaling of the output of the quantizer 320 can be performed by a comparator, such as comparator 730, which can be used to scale the quantizer output by the scale factor b1. According to a preferred embodiment of the present invention, depending upon the binary value of the output of the quantizer 320, the comparator 730 can provide either b1, b⅓, −b1, or −b⅓ to an input of the first two-input adder 705.

The reset circuit 330 (not shown in FIG. 7) can be an automatic reset circuit that can reset the sigma-delta modulator 300 should the sigma-delta modulator 300 enter an unstable state. According to a preferred embodiment of the present invention, the second first-order integrator 411 of the second integrator 310 (hereby referred to as the fourth integrator) uses four (4) sign bits, thereby allowing values up to approximately 8.0 to be represented. The quantizer 320, on the other hand, can be overloaded if its input exceeds an absolute value of 1.33. Simulations of typical DSL systems have shown that the sigma-delta modulator 300 can operate in the overloaded region, however, the typical maximum value is less than 2.0. Furthermore, simulations indicate that when the sigma-delta modulator 300 does become unstable, the fourth integrator will become saturated. Therefore, it can be sufficient to have the reset circuit 330 examine the two most significant bits of the output of the fourth integrator. Based upon the value of the two most significant bits of the output of the fourth integrator, the reset circuit 330 can perform a reset of the sigma-delta modulator 300.

Figure 8:
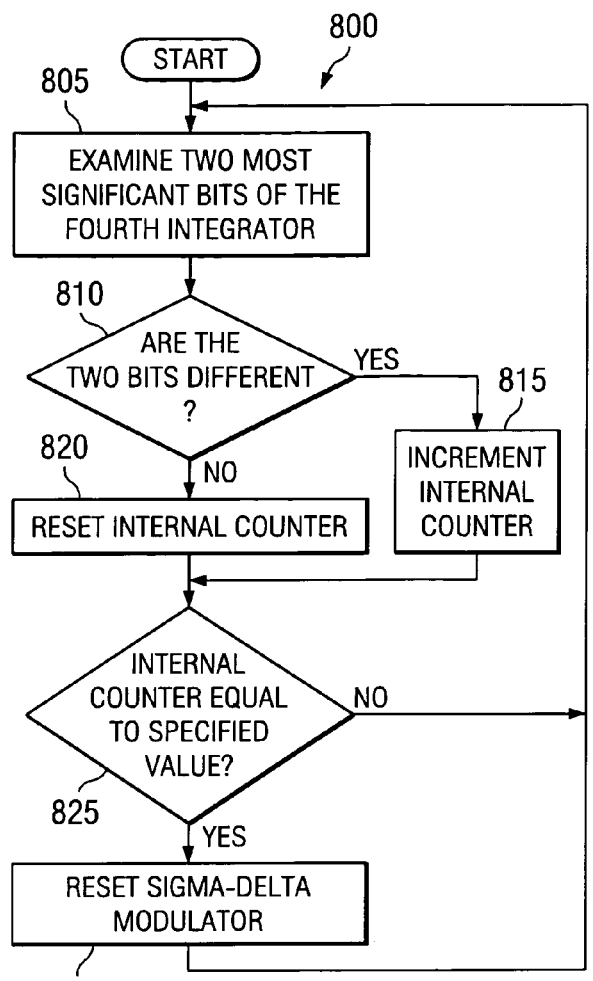
FIG. 8 is a flow diagram of an algorithm for determining if a sigma-delta modulator has become unstable, according to a preferred embodiment of the present invention.

With reference now to FIG. 8, there is shown a flow diagram illustrating an algorithm 800 for determining if the sigma-delta modulator 300 has become unstable, according to a preferred embodiment of the present invention. The algorithm 800 may be executed by the reset circuit 330 in order to determine if the sigma-delta modulator 300 has become unstable and needs to be reset. The algorithm 800 may be implemented in hardware or as software.

At a specified frequency, perhaps once every clock cycle of the sigma-delta modulator 300, the reset circuit 330 can check the value of the two most significant bits of the fourth integrator (block 805). The reset circuit 330 can check to see if the two bits are different from one another (block 810). If the two bits are different, then the reset circuit 330 can increment an internal counter (block 815). When the two bits are different, it is indicative of the fourth integrator operating in a saturated state.

If the two bits are not different (block 810), then the two bits must be equal. If the two bits are equal, then the reset circuit 330 can reset the internal counter, preferably to zero (block 820). After either incrementing the internal counter (block 815) or resetting the internal counter (block 820), depending upon the value of the two bits, the reset circuit 330 can check the value of the internal counter to determine if it is equal to a specified value (block 825). If the internal counter is equal to the specified value, then the fourth integrator has been operating in the saturated state for the specified value of consecutive samples, indicating that the sigma-delta modulator 300 has become unstable. The reset circuit 330 can then reset the sigma-delta modulator 300 (block 830). The resetting of the sigma-delta modulator 300 may entail the setting of all integrator states back to zero (0) and the internal counter may be set back to zero (0).

In addition to using the reset circuit 330 to detect the instability of the sigma-delta modulator 300, it may be possible to have an external reset input for the sigma-delta modulator 300, wherein an external device (such as a controller) or a user, can force the resetting of the sigma-delta modulator 300.

Figure 9:
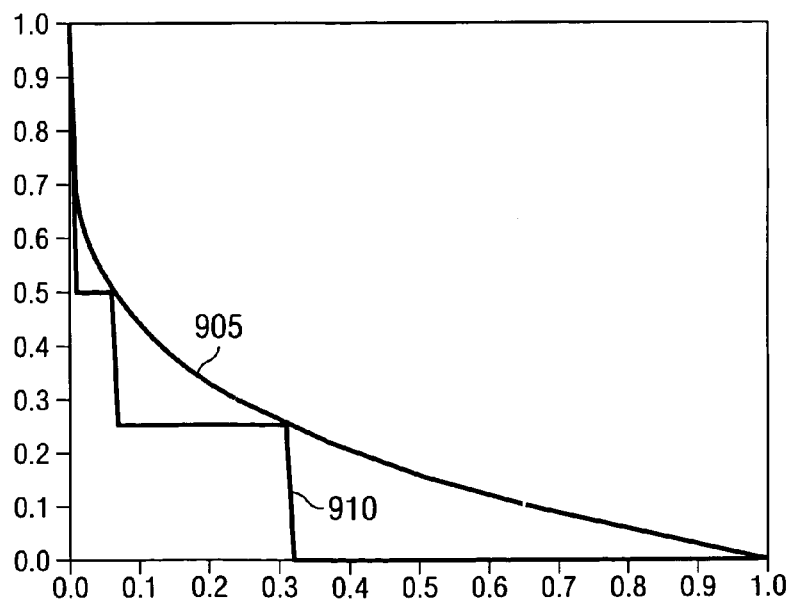
FIG. 9 is a data plot of continuous and quantized versions of an amplitude function used for dynamic dithering, according to a preferred embodiment of the present invention.

With reference now to FIG. 9, there is shown a data plot illustrating continuous and quantized versions of an amplitude function used for dynamic dithering, according to a preferred embodiment of the present invention. The amplitude function can be expressed as:

$$(1-abs(x')^{0.25})*d[n],$$

wherein d[n] is the dithering sequence and x'=x/(sx*stab). Note that x' is the input signal prior to the scale unit 305 and 'sx' and 'stab' are scale factors. The dithering sequence d[n] is a random variable with a triangular probability distribution function (TPDF) and can be formed by adding together two uniformly distributed random variables.

A first curve 905 represents a continuous version of the amplitude function used for dynamic dithering and a second curve 910 represents a quantized version of the amplitude function. The quantization converts the amplitude of the amplitude function into several quantization levels, each of which is a power (negative) of two, to simplify implementation. Note that the quantization can be performed by the non-linear quantizer 425 (FIG. 4). According to a preferred embodiment of the present invention, if the amplitude function is less than $1/512$, then the amplitude is quantized to 0.5, if the amplitude function is in the range ($1/512$, 0.0625], then the amplitude is quantized to 0.25, if the amplitude function is in the range (0.0625, 0.3164], then the amplitude is quantized to 0.125, and if the amplitude function is greater than 0.3164, then the amplitude function is quantized to 0.

As discussed previously, the amount of dithering applied can vary depending upon the magnitude of the input signal. For example, if the magnitude of the input signal is less than 0.3164, then full dithering can be applied, and if the magnitude of the input signal is greater than 0.3164, then no dithering is applied.

Figure 10:
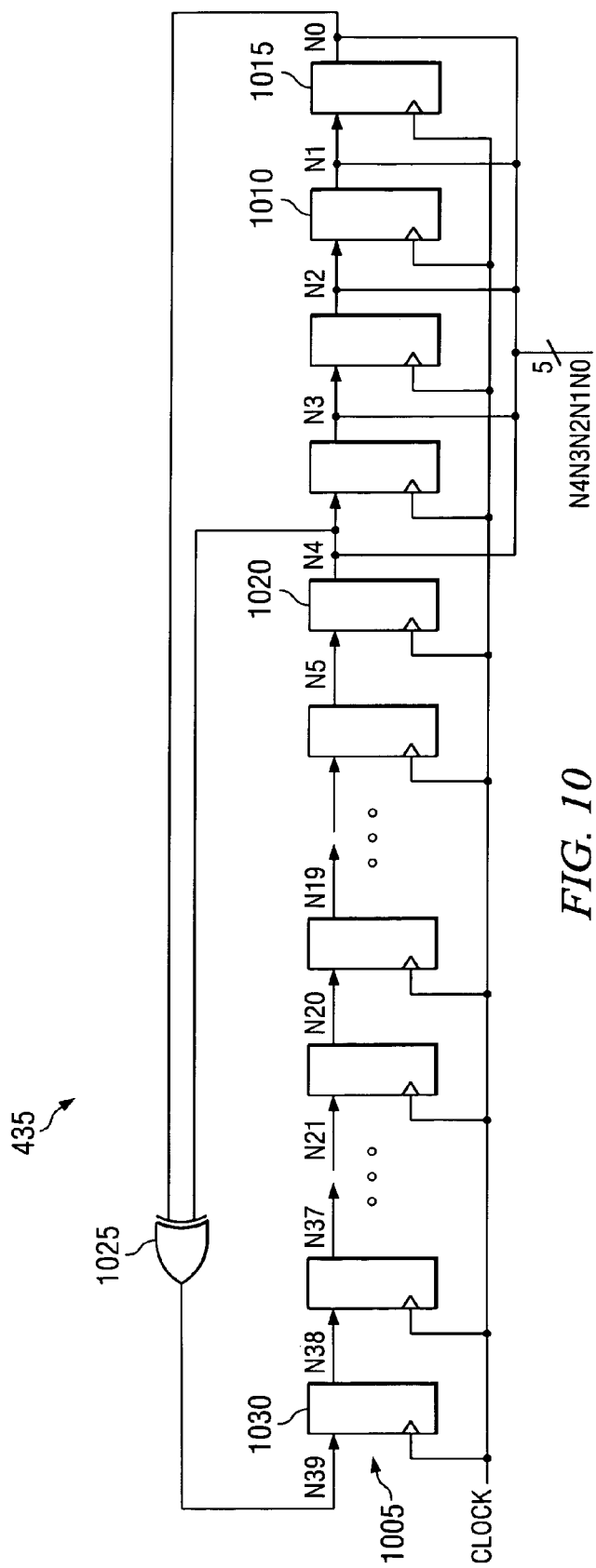
FIG. 10 is a diagram of a dither generator, according to a preferred embodiment of the present invention.

With reference now to FIG. 10, there is shown a diagram illustrating a detailed view of the dither generator 435, according to a preferred embodiment of the present invention. The dither generator 435 can be based upon a pseudo-random number (PN) sequence generator. According to a preferred embodiment of the present invention, the dither generator 435 is based on the generating polynomial $1+x^4+x^{39}$. The dither generator 435 comprises a sequentially coupled sequence of latches 1005, wherein an output of one latch (such as latch 1010) is provided to an input of the next latch in the sequence (such as latch 1015).

The generating polynomial, $1+x^4+x^{39}$, can specify another set of connections for the outputs of the latches in the sequence of latches 1005. The generating polynomial can be re-expressed as: $x^0+x^4+x^{39}$. The exponents of the 'x' terms specifies the output of corresponding latches being provided to an exclusive-or (XOR) gate 1025. With the generating polynomial, $1+x^4+x^{39}$, the outputs of latch #0 (latch 1015) and latch #4 (latch 1020) are provided to the XOR gate 1025. The output of the XOR gate 1025 can then become the input of the last term of the generating polynomial, $x^{39}$, which is latch #39 (latch 1030).

Figure 11:
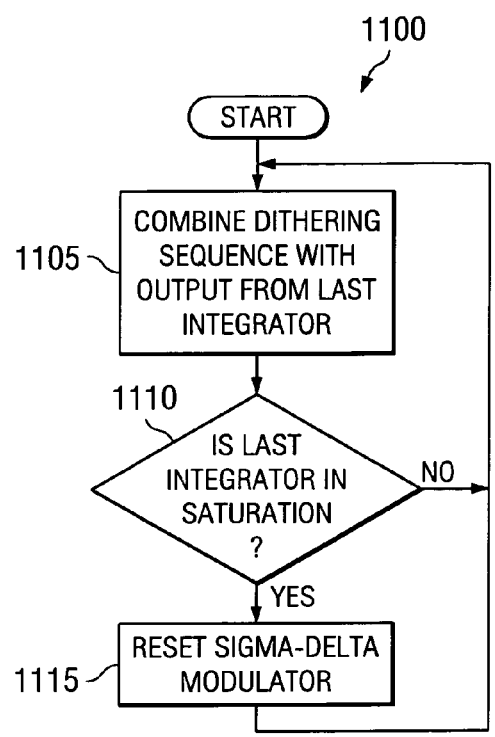
FIG. 11 is a flow diagram of a process for maintaining sigma-delta modulator stability.

With reference now to FIG. 11, there is shown a flow diagram illustrating a process 1100 that can be used in maintaining sigma-delta modulator stability, according to a preferred embodiment of the present invention. According to a preferred embodiment of the present invention, the process 1100 can be used to help maintain stability in the sigma-delta modulator 300. A first operation (block 1105) can be combining a dithering sequence, such as one produced in the dithering logic block 325 (FIG. 3), with an output produced by an integrator, such as the second integrator 310 (FIG. 3). A second operation in the process 1100 (block 1110) can be to determine if an integrator is operating in saturation. According to a preferred embodiment of the present invention, the integrator that is being examined is the same integrator with the output being combined with the dithering sequence. If the integrator has been operating in saturation for a specified period of time, then the sigma-delta modulator 300 can be reset (block 1115). The process 1100 can continue while the sigma-delta modulator 300 is in operation.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A sigma-delta modulator comprising:
   an integrator coupled to a signal input, the integrator configured to sum a difference between an input signal provided at the signal input and an output of the sigma-delta modulator;
   a dithering circuit coupled to the signal input, the dithering circuit configured to produce a dithering sequence;
   a summing point coupled to the integrator and the dithering circuit, the summing point to combine outputs provided by the integrator and the dithering circuit;
   a quantizer coupled to the summing point, the quantizer to convert an output of the summing point into one of several discrete levels; and
   a reset circuit coupled to the integrator, the reset circuit configured to reset the sigma-delta modulator if the integrator becomes saturated.

2. The sigma-delta modulator of claim 1, wherein the sigma-delta modulator is a fourth-order sigma-delta modulator, and wherein the integrator comprises a linear sequence of two second-order integrators.

3. The sigma-delta modulator of claim 2, wherein each second-order integrator comprises:
   a second summing point coupled to an input, the second summing point configured to combine a first scaled feedback signal from an output of the second-order integrator, a signal provided by the input, and a second scaled feedback signal from an output of the quantizer;
   a first first-order integrator coupled to the second summing point, the first first-order integrator configured to accumulate an output produced by the second summing point;
   a third summing point coupled to an output of the first first-order integrator, the third summing point configured to combine a third scaled feedback signal from an output of the quantizer and a signal provided by the first first-order integrator, and
   a second first-order integrator coupled to the third summing point, the second first-order integrator configured to accumulate an output produced by the third summing point.

4. The sigma-delta modulator of claim 3, wherein in the first second-order integrator, the second scaled feedback signal and the third scaled feedback signal are scaled by different scale factors.

5. The sigma-delta modulator of claim 4, wherein the second scaled feedback signal is scaled by a scale factor substantially equal to 0.10950951822876 and the third scaled feedback signal is scaled by a scale factor substantially equal to 0.41941901226110 and the first scaled feedback signal is scaled by a scale factor substantially equal to 0.01776642806738.

6. The sigma-delta modulator of claim 3, wherein in the second second-order integrator, the second scaled feedback signal and the third scaled feedback signal are scaled by different scale factors.

7. The sigma-delta modulator of claim 6, wherein the second scaled feedback signal is scaled by a scale factor substantially equal to 1.00399021176998 and the third scaled feedback signal is scaled by a scale factor substantially equal to 0.85229868030050 and the first scaled feedback signal is scaled by a scale factor substantially equal to 0.00060236260760.

8. The sigma-delta modulator of claim 1, wherein the dithering circuit comprises:
   a magnitude quantization unit coupled to the signal input, the magnitude quantization unit configured to scale the amount of dithering based upon the magnitude of the input signal;
   a dither generator configured to generate a dithering sequence based upon a pseudo-random number (PN) sequence; and
   a fourth summing point coupled to the magnitude quantization unit and the dither generator, the fourth summing point to combine the dithering sequence with a scaled version of the input signal.

9. The sigma-delta modulator of claim 8, wherein the magnitude quantization unit comprises:
   a magnitude unit configured to provide an absolute value of the input signal; and
   a quantizer coupled to the magnitude unit, the quantizer to convert an output of the magnitude unit into one of several discrete levels.

10. The sigma-delta modulator of claim 8, wherein the dithering circuit further comprises a delay having an input coupled to an output of the magnitude quantization unit and an output coupled to the fourth summing point, the delay configured to synchronize the output of the magnitude quantization unit with the output of the integrator.

11. The sigma-delta modulator of claim 1, wherein the integrator becomes saturated if the two most significant bits of an output produced by the integrator remain different for a specified amount of time.

12. The sigma-delta modulator of claim 11, wherein resetting the sigma-delta modulator comprises setting all integrator states to zero.

13. The sigma-delta modulator of claim 1 fhrther comprising a reset input wherein a specific signal on the reset input results in the resetting of the sigma-delta modulator.

14. The sigma-delta modulator of claim 1, wherein the quantizer has four discrete levels.

15. A multi-standard digital subscriber line (DSL) sigma-delta digital-to-analog converter (DAC) comprising:
   an inverse Fourier transform unit coupled to a signal input, the inverse Fourier transform unit configured to convert a frequency domain symbol into a time domain symbol;
   an interpolation chain coupled to the inverse Fourier transform unit, the interpolation chain configured to upsample the time domain symbol; and
   a sigma-delta modulator coupled to the interpolation chain, the sigma-delta modulator configured to convert the time domain symbol into an analog signal, wherein the sigma-delta modulator includes a dithering circuit and a reset circuit.

16. The multi-standard DSL sigma-delta DAC of claim 15, wherein the sigma-delta modulator comprises:
   an integrator coupled to the interpolation chain, the integrator configured to sum a difference between an input signal provided at the interpolation chain and an output of the sigma-delta modulator;
   a dithering circuit coupled to the interpolation chain, the dithering circuit configured to produce a dithering sequence;
   a summing point coupled to the integrator and the dithering circuit, the summing point to combine outputs provided by the integrator and the dithering circuit;
   a quantizer coupled to the summing point, the quantizer to convert an output of the summing point into one of several discrete levels; and a reset circuit coupled to the integrator, the reset circuit configured to reset the sigma-delta modulator if the integrator becomes saturated.

17. The multi-standard DSL sigma-delta DAC of claim 16, wherein the integrator is a fourth-order integrator.

18. The multi-standard DSL sigma-delta DAC of claim 17, wherein the fourth-order integrator is implemented as a sequence of two second-order integrators.

19. The multi-standard DSL sigma-delta DAC of claim 15, wherein the DSL standards supported by the DSL modem is one or more of the following: G.Lite, ADSL, and ADSL+.

20. A method for resetting a sigma-delta modulator, the method comprising:
  examining two most significant bits of a signal produced by an integrator in the sigma-delta modulator;
  incrementing a counter if the two most significant bits are different;
  resetting the counter if the two most significant bits are equal; and
  resetting the sigma-delta modulator if the counter reaches a specified value.

21. The method of claim 20, wherein the resetting comprises setting all states in the integrator to zero.

22. The method of claim 21, wherein a counter is used to determine the amount of time the integrator has been operating in saturation, and wherein the resetting further comprises resetting the counter to zero.

23. The method of claim 20, wherein the integrator is the integrator closest to an output of the sigma-delta modulator if the sigma-delta modulator has more than one integrator.

24. A method for maintaining sigma-delta modulator stability, the method comprising:
  combining a dithering sequence with an output of an integrator, wherein the integrator is a part of the sigma-delta modulator;
  determining if the sigma-delta modulator has become unstable by
    examining the two most significant bits of a signal produced by the integrator,
    incrementing a counter if the two most significant bits are different, and
    resetting the counter if the two most significant bits are equal; and
  resetting the sigma-delta modulator if the sigma-delta modulator has become unstable.

25. The method of claim 24, wherein the resetting comprises setting all states in the integrator to zero.

26. The method of claim 25, wherein a counter is used to determine instability, and wherein the resetting further comprises setting the counter to zero.

27. The method of claim 24, wherein the sigma-delta modulator is reset if the counter reaches a specified value.

* * * * *